(12) United States Patent
Ko et al.

(10) Patent No.: US 7,991,376 B2
(45) Date of Patent: Aug. 2, 2011

(54) MIXER USED FOR DIRECT CONVERSION RECEIVER

(75) Inventors: Won Ko, Seoul (KR); Sung-gi Yang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 748 days.

(21) Appl. No.: 12/106,475

(22) Filed: Apr. 21, 2008

(65) Prior Publication Data

US 2008/0280584 A1    Nov. 13, 2008

(30) Foreign Application Priority Data

May 8, 2007    (KR) .................. 10-2007-0044718

(51) Int. Cl.
*H04B 1/26* (2006.01)
(52) U.S. Cl. .................. 455/323; 455/333; 330/258
(58) Field of Classification Search .................. 455/323, 455/324, 326, 333; 330/258, 85, 98, 99, 330/254

See application file for complete search history.

(56) References Cited

U.S. PATENT DOCUMENTS

| | | | |
|---|---|---|---|
| 6,865,382 B2 * | 3/2005 | Behzad | 455/323 |
| 7,259,569 B2 * | 8/2007 | Kim | 324/601 |
| 7,570,099 B2 * | 8/2009 | Lin et al. | 327/356 |
| 7,831,234 B2 * | 11/2010 | Schelmbauer et al. | 455/323 |

FOREIGN PATENT DOCUMENTS

| | | |
|---|---|---|
| KR | 1020050068566 A | 7/2005 |
| KR | 1020050077982 A | 8/2005 |
| KR | 1020060080387 A | 7/2006 |

\* cited by examiner

Primary Examiner — Christian A Hannon
(74) Attorney, Agent, or Firm — Volentine & Whitt, PLLC

(57) ABSTRACT

Provided is a mixer including a mixing unit configured to mix high frequency data signals and local oscillation (LO) signals, generate first and second low frequency data signals, and output the first and second low frequency data signals to first and second output terminals, respectively; a common mode amplification unit coupled to the mixing unit, the common mode amplification unit configured to compare a common mode voltage of the first and second low frequency data signals and a predetermined reference voltage, the common mode amplification unit further configured to output a feedback signal at a control node based on the comparison; a first load transistor coupled to the first output terminal and the control node, the first load transistor configured to provide the first output terminal with a first load current corresponding to the feedback signal; a first calibration transistor unit connected in parallel to the first load transistor in order to calibrate an input impedance of the first output terminal; and a first current mirror unit coupled to the first calibration transistor unit, the first current mirror unit configured to discharge a first calibration current that is output from the first calibration transistor unit to prevent the first calibration current from entering the first output terminal.

20 Claims, 5 Drawing Sheets

MIXER USED FOR DIRECT CONVERSION RECEIVER

CROSS-REFERENCE TO RELATED PATENT APPLICATION

This application claims the benefit of Korean Patent Application No. 10-2007-0044718, filed on May 8, 2007 in the Korean Intellectual Property Office, the disclosure of which is incorporated herein by reference in its entirety.

BACKGROUND OF THE INVENTION

1. Field of the Invention

The present invention relates generally to a mixer used for a direct conversion receiver, and more particularly, but without limitation, to a mixer for reducing a second-order intermodulation (IM2) component included in a low frequency data signal.

2. Description of the Related Art

Low frequency baseband data signals are up-converted into high frequency radio frequency (RF) band data signals in transmitters of communication systems. High frequency RF band data signals are down-converted into low frequency baseband data signals in communication system receivers. A heterodyne method or a direct conversion method may be used to transmit and receive data signals. The heterodyne method uses an intermediate frequency (IF) band, whereas the direct conversion method directly up-converts low frequency baseband data signals into high frequency RF band data signals and then directly down-converts high frequency RF band data signals into low frequency baseband data signals.

FIG. 1 is a partial circuit diagram of a conventional direct down-conversion transceiver. Referring to FIG. 1, the conventional direct down-conversion transceiver includes an antenna 101, a duplexer 102, a transmission end Tx 103, a reception end Rx 104, a low noise amplifier (LNA) 105, a surface acoustic wave (SAW) filter 106, and a mixer 110.

When the conventional direct down-conversion transceiver serves as a transmitter, a transmission signal is transmitted through the transmission end Tx 103, the duplexer 102, and the antenna 101. When the conventional direct down-conversion transceiver serves as a receiver, a signal received through the antenna 101 is input into the LNA 105 through the duplexer 102 and the reception end Rx 104. The signal amplified by the LNA 105 is input into the mixer 110 through the SAW filter 106. The mixer 110 mixes an input high frequency data signal radio frequency (RF) and a local oscillation (LO) signal and generates a low frequency data signal Vpn. In more detail, the mixer 110 generates the low frequency data signal Vpn having a frequency corresponding to a difference between frequencies of the high frequency data signal RF and the LO signal.

FIG. 2A is a graph illustrating heterodyne down-conversion, and FIG. 2B is a graph illustrating direct down-conversion. Referring to FIGS. 2A and 2B, a horizontal axis indicates a frequency, and a vertical axis indicates signal amplitude. RFx denotes a transmission signal, RFy denotes a signal adjacent to RFx, and LO denotes an LO signal. Intermodulation is a type of signal interference that is the result of two or more signals of different frequencies being mixed together. Accordingly, the adjacent signal RFy may cause noise to occur in the transmission signal RFx.

Referring to FIG. 2A, both signals RFy and RFx are down-converted into IF band signals according to the heterodyne down-conversion. In more detail, an IF band includes a frequency f1-f3 of a mixing signal of the signal RFx and the LO signal LO, and a frequency f2-f3 of a mixing signal of the adjacent signal RFy and the LO signal LO. Meanwhile, a frequency f1-f2 of a second-order intermodulation (IM2) component caused by the intermodulation between signals RFy and RFx does not belong to the IF band, and therefore the IM2 component can be easily removed by performing band reject filtering.

Referring to FIG. 2B, both signals RFy and RFx are down-converted into baseband signals according to the direct down-conversion. In more detail, a baseband includes a frequency f1-f3 of a mixing signal of the signal RFx and the LO signal LO, and a frequency f2-f3 of a mixing signal of the adjacent signal RFy and the LO signal LO. However, a frequency f1-f2 of the IM2 component caused by the intermodulation between signals RFy and RFx belongs to the baseband too, making it impossible to remove the IM2 component by performing band reject filtering. Therefore, a method of removing the IM2 component is additionally needed.

FIG. 3 is a circuit diagram of a conventional mixer 110 including a circuit used to remove the IM2 component. Referring to FIG. 3, the mixer 110 is used as one of the constituents of the conventional direct down-conversion receiver illustrated in FIG. 1.

In order to remove the IM2 component, the mixer 110 includes resistive circuits Rp, Rpc, Rn, and Rnc that are connected between a power voltage source VDD and output terminals TER1 and TER2, and a mixing unit (MU) that mixes high frequency data signals RFp and RFn and LO signals LOp and LOn and outputs low frequency data signals Vp and Vn. Iim2_d denotes a differential current of the IM2 component included in the low frequency data signals Vp and Vn. Iim2_c denotes a common current of the IM2 component included in the low frequency data signals Vp and Vn.

If a value of combination resistance of the resistors Rp and Rpc is $(R+\Delta R)$, and a value of combination resistance of the resistors Rn and Rnc is $(R-\Delta R)$, the IM2 component [Vpn(fim2)] included in the low frequency data signals Vp and Vn can be approximated according to Equation 1, $$Vpn(fim2) = R*Iim2\_d \pm \Delta R*Iim2\_c \quad (1)$$

wherein, fim2 denotes a frequency of the IM2 component.

Referring to Equation 1, proper control of a value $\Delta R$ can minimize the IM2 component [Vpn(fim2)] included in the low frequency data signals Vp and Vn. The value of $\Delta R$ can be controlled by changing the value of combination resistance of the resistors Rp and Rpc by varying a value of the resistor Rpc connected in parallel to the resistor Rp, or by changing the value of combination resistance of the resistors Rn and Rnc by varying a value of the resistor Rnc connected in parallel to the resistor Rn.

For example, if the resistor Rp is 1 k$\Omega$, the value of the resistor Rpc must be 99 k$\Omega$ in order that the value of combination resistance of the resistors Rp and Rpc is 0.99 k$\Omega$. In other words, it is necessary to specify a resistor Rpc with a value more than a hundred times larger than the resistor Rp in parallel in order to reduce the combination resistance value by 1%. However, the resistor having such a large resistance value needs a large area in order to be realized in a system chip, which increases the overall area of the system chip. Therefore, an additional method is needed for high integration of the system chip.

SUMMARY OF THE INVENTION

The present invention provides a mixer capable of reducing a second-order intermodulation (IM2) component using a limited area.

The present invention also provides a mixer capable of preventing a DC offset when the IM2 component is reduced.

According to an aspect of the present invention, there is provided a mixer.

The mixer includes: a mixing unit configured to mix high frequency data signals and local oscillation (LO) signals, generate first and second low frequency data signals, and output the first and second low frequency data signals to first and second output terminals, respectively; a common mode amplification unit coupled to the mixing unit, the common mode amplification unit configured to compare a common mode voltage of the first and second low frequency data signals and a predetermined reference voltage, the common mode amplification unit further configured to output a feedback signal at a control node based on the comparison; a first load transistor coupled to the first output terminal and the control node, the first load transistor configured to provide the first output terminal with a first load current corresponding to the feedback signal; a first calibration transistor unit connected in parallel to the first load transistor in order to calibrate an input impedance of the first output terminal; and a first current mirror unit coupled to the first calibration transistor unit, the first current mirror unit configured to discharge a first calibration current that is output from the first calibration transistor unit to prevent the first calibration current from entering the first output terminal.

BRIEF DESCRIPTION OF THE DRAWINGS

The above objects and advantages of the invention will become more apparent by describing in detail preferred embodiments thereof with reference to the attached drawings in which.

DESCRIPTION OF THE PREFERRED EMBODIMENTS

Figure 4:
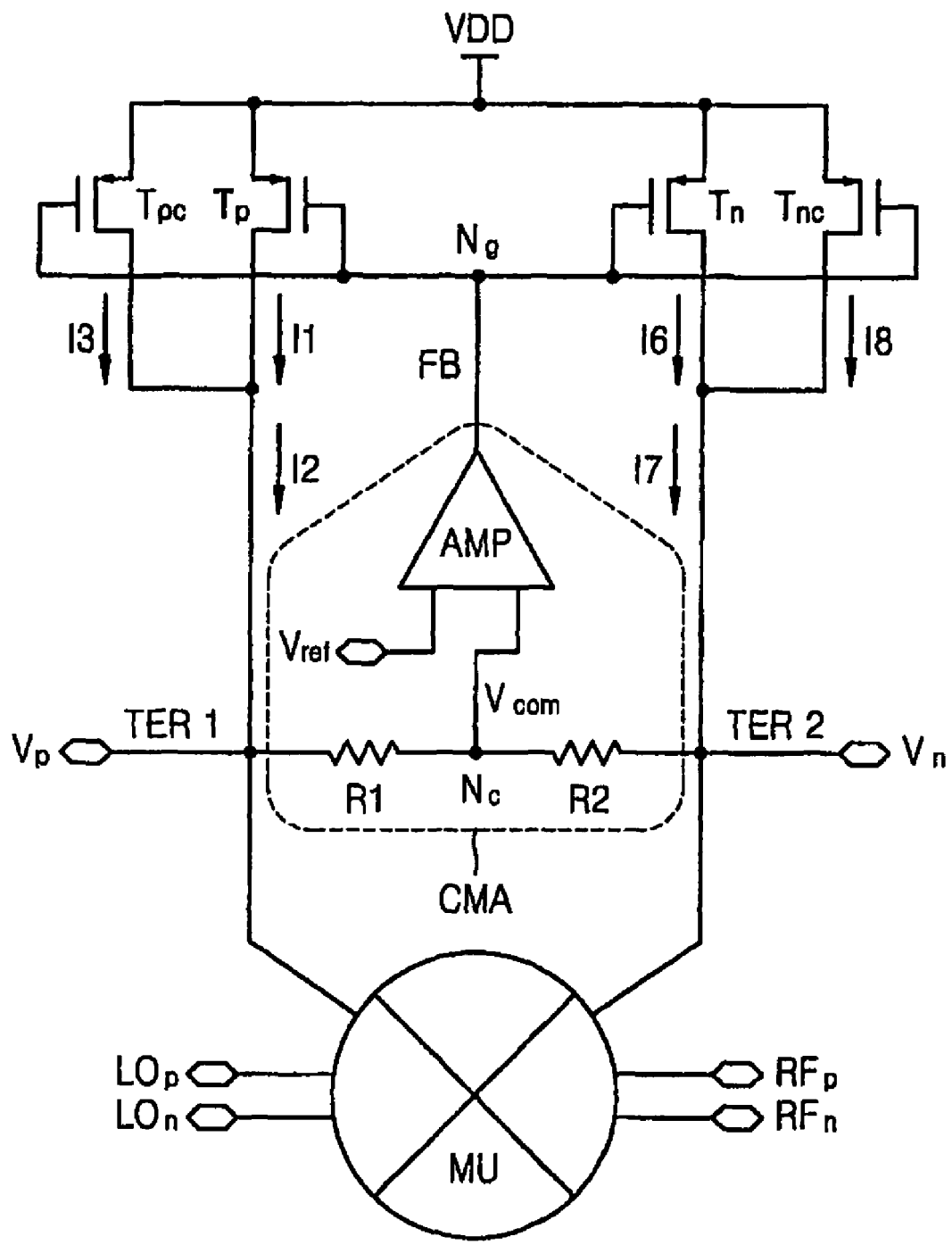
FIG. 4 is a circuit diagram of a mixer capable of reducing a second-order intermodulation (IM2) component using a limited area according to an embodiment of the invention.

FIG. 4 is a circuit diagram of a mixer capable of reducing a second-order intermodulation (IM2) component using a limited area according to an embodiment of the invention. Referring to FIG. 4, the mixer includes a mixing unit MU, a common mode amplification unit CMA, a first load transistor Tp, a first calibration transistor Tpc, a second load transistor Tn, and a second calibration transistor Tnc.

The mixing unit MU mixes high frequency data signals RFp and RFn and local oscillation (LO) signals LOp and LOn and generates first and second low frequency data signals Vp and Vn. The first and second low frequency data signals Vp and Vn are output to first and second output terminals TER1 and TER2, respectively.

The common mode amplification unit CMA compares a common mode voltage Vcom of the first and second low frequency data signals Vp and Vn and a predetermined reference voltage Vref and outputs a feedback signal FB. The common mode amplification unit CMA includes a first common resistor R1 connected between the first output terminal TER1 and a common mode Nc, a second common resistor R2 connected between the second output terminal TER2 and the common mode Nc, and an amplifier AMP that compares the reference voltage Vref and the common mode voltage Vcom and outputs the feedback signal FB to a control node Ng.

The first load transistor Tp is connected between a power voltage source VDD and the first output terminal TER1, and provides the first output terminal TER1 with a first load current I1 corresponding to the feedback signal FB. The first calibration transistor Tpc is connected in parallel to the first load transistor Tp. The second load transistor Tn is connected between the power voltage source VDD and the second output terminal TER2, and provides the second output terminal TER2 with a second load current I6 corresponding to the feedback signal FB. The second calibration transistor Tnc is connected in parallel to the second load transistor Tn.

Figure 1:
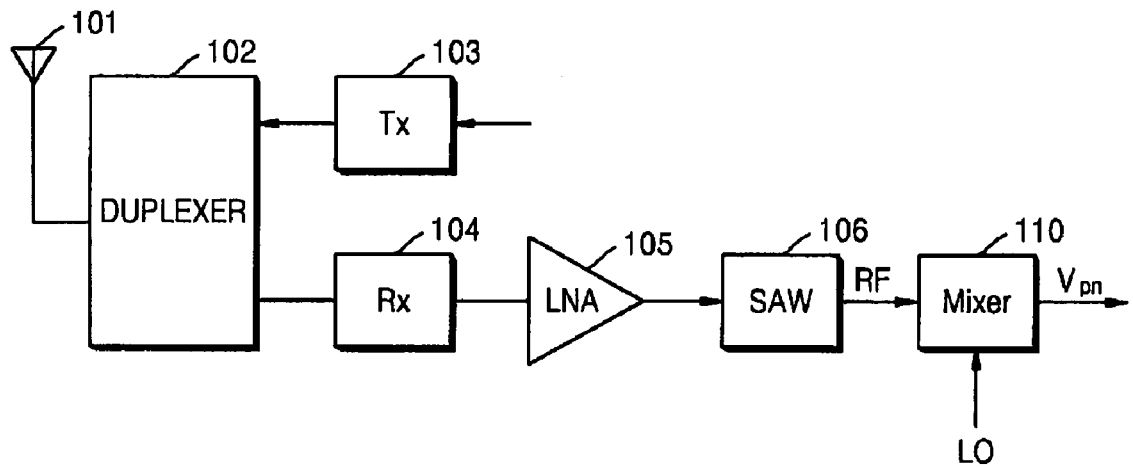
FIG. 1 is a partial circuit diagram of a conventional direct down-conversion transceiver.
Figure 2A:
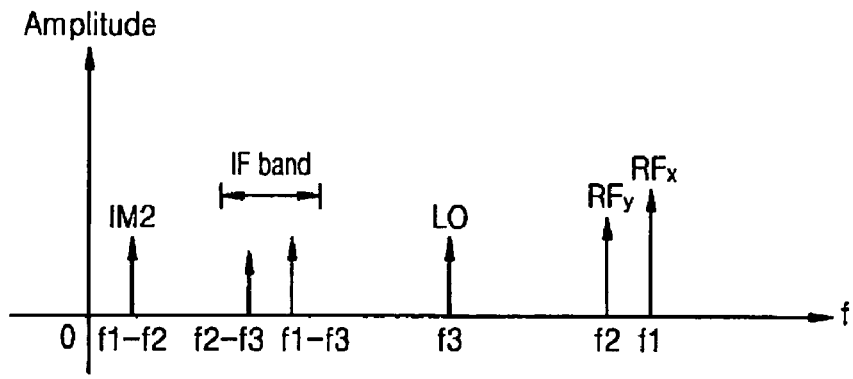
FIG. 2A is a graph illustrating heterodyne down-conversion.
Figure 2B:
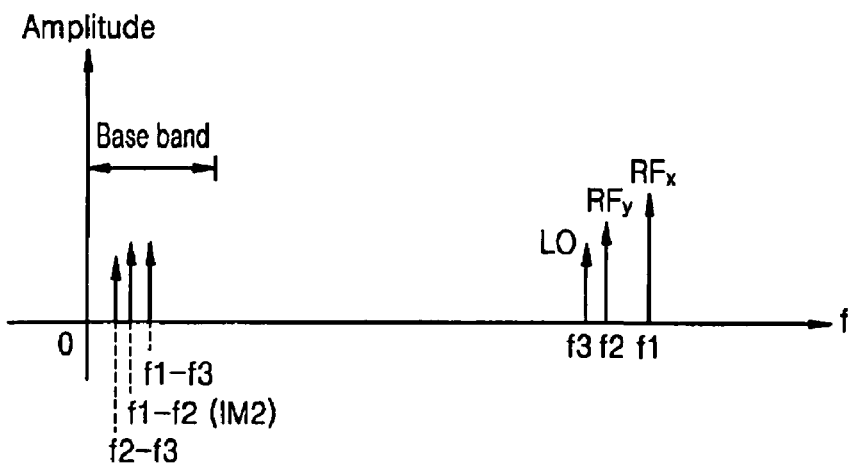
FIG. 2B is a graph illustrating direct down-conversion.
Figure 3:
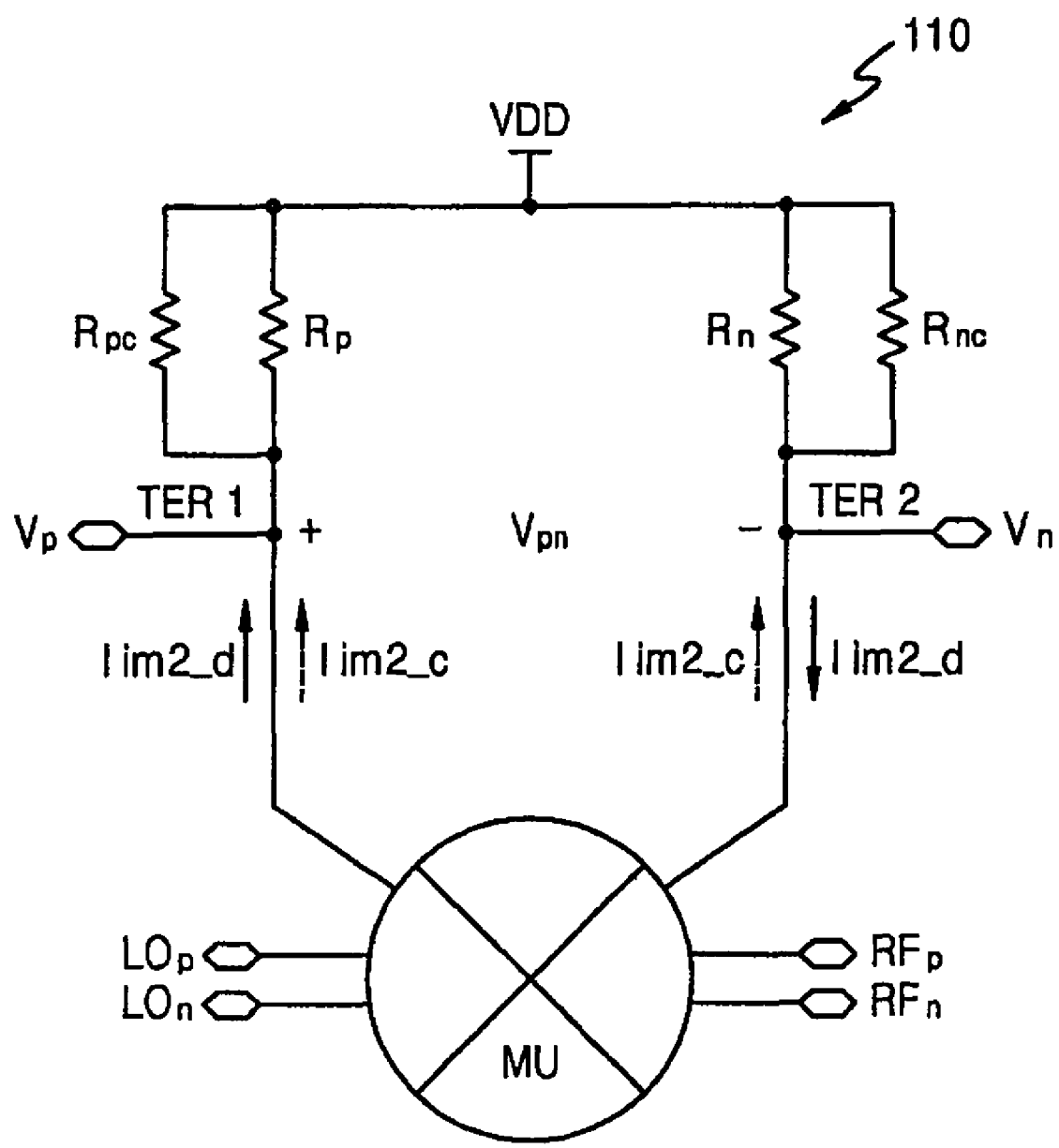
FIG. 3 is a circuit diagram of a conventional mixer including a circuit used to remove the IM2 component.

Equivalent impedances of the first load transistor Tp, the first calibration transistor Tpc, the second load transistor Tn, and the second calibration transistor Tnc are Zp, Zpc, Zn, and Znc, respectively. A value of combination impedance of impedances Zp and Zpc is (Z+ΔZ), and a value of combination impedance of impedances Zn and Znc is (Z−ΔZ). In this case, if R1=R2=Rc, the IM2 component [Vpn(fim2)] included in the first and second low frequency data signals Vp and Vn can be approximated according to Equation 2, $$Vpn(f_{im2}) = \frac{RcZ}{Rc+Z}\text{Iim2\_d} \pm \frac{Rc\Delta Z}{Rc+Z}\text{Iim2\_c} \quad (2)$$

wherein, fim2 denotes a frequency of the IM2 component, Iim2_d denotes a differential current of the IM2 component, and Iim2_c denotes a common current of the IM2 component (see FIG. 3).

Referring to Equation 2, proper control of a value ΔZ can minimize the IM2 component [Vpn(fim2)]. In more detail, proper selection of the equivalent impedances Zpc and Znc of the first and second calibration transistors Tpc and Tnc results in the minimization of the IM2 component [Vpn(fim2)] included in the first and second low frequency data signals Vp and Vn.

Unlike the conventional embodiment shown in FIG. 3 where the resistors Rpc and Rnc are passive elements, the mixer embodiment illustrated in FIG. 4 uses active elements (e.g., transistors Tpc and Tnc). A system chip realized with transistors needs a relatively smaller area than a system chip realized with resistors. Embodiments of the invention thus provide a mixer capable of reducing the IM2 component that requires less area than conventional mixer circuits.

As shown in FIG. 4, a first load current I1 is output from the load transistor Tp, a first calibration current I3 is output from the first calibration transistor Tpc, and a terminal current I2 enters the first output terminal TER1. If the first calibration transistor Tpc is not connected to the first load transistor Tp, then I2=I1. But if the first calibration transistor Tpc is connected in parallel to the first load transistor Tp, then I2=I1+I3. If the first calibration current I3 increases or decreases the current I2, then a DC offset may occur in the first and second low frequency data signals Vp and Vn. Likewise, a DC offset may occur if a second calibration current I8 increases or decreases a terminal current I7 that enters the second output terminal TER2. Therefore, the first and second calibration currents I3 and I8 must be carefully managed in order to prevent such DC offset from occurring.

Figure 5:
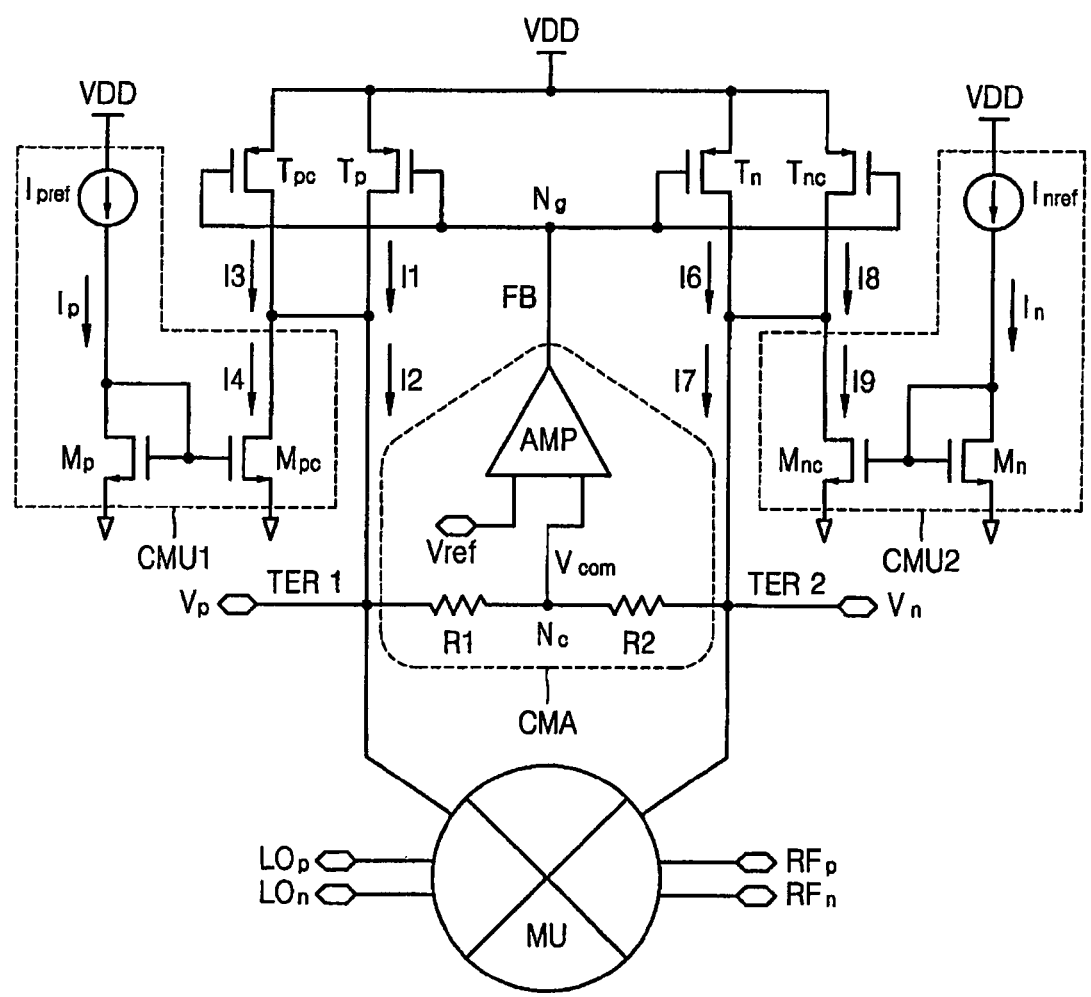
FIG. 5 is a circuit diagram of a mixer according to an embodiment of the invention.

FIG. 5 is a circuit diagram of a mixer according to an embodiment of the invention. Referring to FIG. 5, the mixer includes a mixing unit MU, a common mode amplification unit CMA, a first load transistor Tp, a first calibration transistor Tpc, a first current mirror unit CMU1, a second load transistor Tn, a second calibration transistor Tnc, and a second current mirror unit CMU2.

As described with reference to FIG. 4, the mixing unit MU mixes high frequency data signals RFp and RFn and LO signals LOp and LOn and outputs first and second low frequency data signals Vp and Vn to first and second output terminals TER1 and TER2, respectively.

The common mode amplification unit CMA includes a first common resistor R1 connected between the first output terminal TER1 and a common mode Nc, a second common resistor R2 connected between the second output terminal TER2 and the common mode Nc, and an amplifier AMP that compares a predetermined reference voltage Vref and a common mode voltage Vcom that is input from the common mode Nc and outputs a feedback signal FB to a control node Ng. The common mode voltage Vcom of the first and second low frequency data signals Vp and Vn is acquired by distributing voltages using the first and second common resistors R1 and R2. An electric potential (e.g., a voltage level of the feedback signal FB) of the control node Ng is controlled in response to a signal (e.g., the common mode voltage Vcom) that is feedback from the first and second output terminals TER1 and TER2. A first load current I1 and a second load current I6 increase in response to the electric potential of the control node Ng. The first and second low frequency data signals Vp and Vn increase in response to an increase and decrease of the first and second load currents I1 and I6. In this regard, the common mode amplification unit CMA, the first load transistor Tp, and the second load transistor Tn are considered as a common mode feedback circuit.

The first calibration transistor Tpc is connected in parallel to the first load transistor Tp between a power voltage source VDD and the first output terminal TER1. A first load current I1 is output from the first load transistor Tp in response to the feedback signal FB. A first calibration current I3 is output from the first calibration transistor Tpc in response to the feedback signal FB. The second calibration transistor Tnc is connected in parallel to the second load transistor Tn between the power voltage source VDD and the second output terminal TER2. The second load current I6 is output from the second load transistor Tn in response to the feedback signal FB. The second calibration current I8 is output from the second calibration transistor Tnc in response to the feedback signal FB.

As described with reference to FIG. 4 and Equation 2, proper selection of equivalent impedances Zpc and Znc of the first and second calibration transistors Tpc and Tnc can minimize an IM2 component included in the first and second low frequency data signals Vp and Vn. In more detail, the IM2 component included in the first and second low frequency data signals Vp and Vn can be minimized by calibrating input impedances of the first and second output terminals TER1 and TER2. The input impedance of the first output terminal TER1 is determined according to a value of composite impedance of the first load transistor Tp and the first calibration transistor Tpc that are connected in parallel. Because the first current mirror unit CMU1 has a very large input impedance, the first current mirror unit CMU1 does not significantly affect the input impedance of the first output terminal TER1. Likewise, the input impedance of the second output terminal TER2 is determined according to a value of composite impedance of the second load transistor Tn and the second calibration transistor Tnc, and the second current mirror unit CMU2 does not significantly affect the input impedance of the second output terminal TER2.

The first current mirror unit CMU1 included in the mixer of FIG. 5 discharges the first calibration current I3 that is output from the first calibration transistor Tpc through a separate path. If the first calibration current I3 that is output from the first calibration transistor Tpc increases or decreases a current I2 that enters the first output terminal TER1, a DC offset may occur in the first and second low frequency data signals Vp and Vn. The first current mirror unit CMU1 of the mixer in FIG. 5 discharges the first calibration current I3 through the separate path in order to prevent the DC offset from occurring. In more detail, the first current mirror unit CMU1 makes it possible to satisfy I4=I3 and I2=I1.

The first current mirror unit CMU1 includes a first mirror current source Ipref, a first mirror transistor Mp, and a first discharge transistor Mpc. The first mirror current source Ipref provides the first mirror transistor Mp with a first control current Ip corresponding to the first calibration current I3. If a mirror current ratio of the first mirror transistor Mp and the first discharge transistor Mpc is 1:1, then Ip=I4. In this case, the first mirror current source Ipref provides the first mirror transistor Mp with the first control current Ip satisfying Ip=I4=I3.

Likewise, the second current mirror unit CMU2 discharges the second calibration current I8 output from the second calibration transistor Tnc through a separate path in order to prevent the second calibration current I8 from entering the second output terminal TER2. The second current mirror unit CMU2 makes it possible to satisfy I9=I8 and I7=I6, so that the second calibration current I8 does not increase or decrease a current I7 that enters the second output terminal TER2. The second current mirror unit CMU2 includes a second mirror current source Inref, a second mirror transistor Mn, and a second discharge transistor Mnc. If a mirror current ratio of the second mirror transistor Mn and the second discharge transistor Mnc is 1:1, then the second mirror current source Inpref provides the second mirror transistor Mn with a second control current In satisfying In=I9=I8.

Although the mixer illustrated in FIG. 5 includes the calibration circuits Tpc and CMU1 that are connected to the first output terminal TER1 and the calibration circuits Tnc and CMU2 that are connected to the second output terminal TER2, the invention is not limited thereto. In alternative embodiments, the mixer can include only one of the calibration transistors and associated CMU. For example, the mixer could include the mixing unit MU, the common mode amplification unit CMA, the first load transistor Tp, the second load transistor Tn, the first calibration transistor Tpc, and the first current mirror unit CMU1 without the second calibration transistor Tnc and without the second current mirror unit CMU2. Alternatively, the mixer could include the mixing unit MU, the common mode amplification unit CMA, the first load transistor Tp, the second load transistor Tn, the second calibration transistor Tnc, and the second current mirror unit CMU2 without the first calibration transistor Tpc and without the first current mirror unit CMU1.

Figure 6:
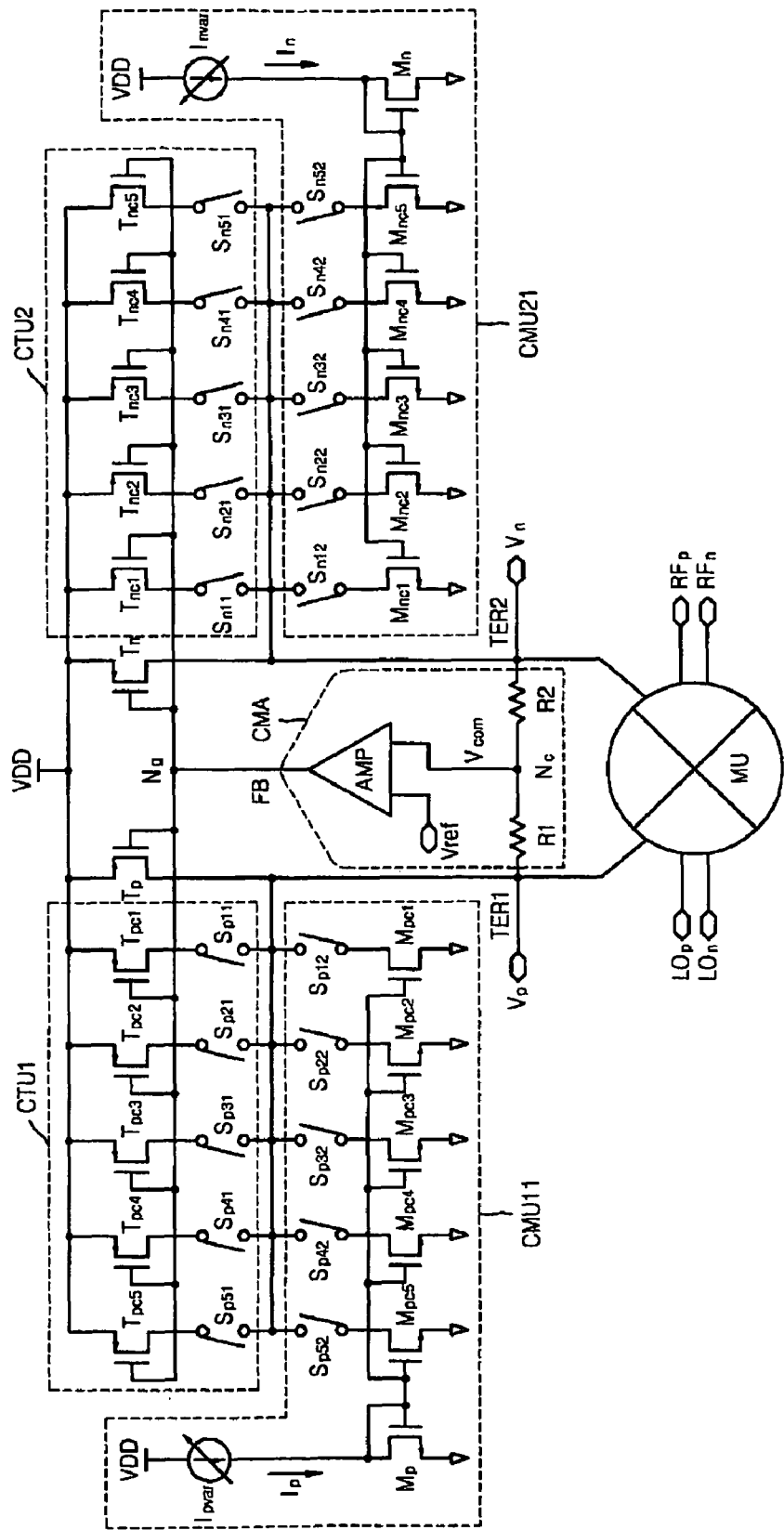
FIG. 6 is a circuit diagram of a mixer according to another embodiment of the invention.

FIG. 6 is a circuit diagram of a mixer according to another embodiment of the invention. Referring to FIG. 6, the mixer includes a mixing unit MU, a common mode amplification unit CMA, a first load transistor Tp, a first calibration transistor unit CTU1, a first current mirror unit CMU11, a second load transistor Tn, a second calibration transistor unit CTU2, and a second current mirror unit CMU21.

The first calibration transistor unit CTU1 includes calibration transistors Tpc1, Tpc2, Tpc3, Tpc4, Tpc5 and switches Sp11, Sp21, Sp31, Sp41, Sp51. The first current mirror unit CMU11 includes mirror transistors Mpc1, Mpc2, Mpc3, Mpc4, Mpc5, Mp, switches Sp12, Sp22, Sp32, Sp42, Sp52, and current source Ipvar. The second calibration transistor unit CTU2 includes calibration transistors Tnc1, Tnc2, Tnc3, Tnc4, Tnc5 and switches Sn11, Sn21, Sn31, Sn41, Sn51. The second current mirror unit CMU21 includes mirror transistors Mnc1, Mnc2, Mnc3, Mnc4, Mnc5, Mn, switches Sn12, Sn22, Sn32, Sn42, Sn52, and current source Invar.

The mixing unit MU mixes high frequency data signals RFp and RFn and LO signals LOp and LOn and outputs first and second low frequency data signals Vp and Vn to first and second output terminals TER1 and TER2, respectively.

The common mode amplification unit CMA compares a predetermined reference voltage Vref and a common mode voltage Vcom of the first and second low frequency data signals Vp and Vn and outputs a feedback signal FB. The common mode amplification unit CMA comprises a first common resistor R1 connected between the first output terminal TER1 and a common mode Nc, a second common resistor R2 connected between the second output terminal TER2 and the common mode Nc, and an amplifier AMP that compares the reference voltage Vref and the common mode voltage Vcom and outputs the feedback signal FB to a control node Ng.

The first load transistor Tp is connected between the power voltage source VDD and the first output terminal TER1, and provides the first output terminal TER1 with a first load current corresponding to the feedback signal FB. The first load transistor Tp comprises an input terminal connected to the power voltage source VDD, an output terminal connected to the first output terminal TER1, and a control terminal that receives the feedback signal from the control node Ng. The second load transistor Tn is connected between the power voltage source VDD and the second output terminal TER2, and provides the second output terminal TER2 with a second load current corresponding to the feedback signal FB. The second load transistor Tn comprises an input terminal connected to the power voltage source VDD, an output terminal connected to the second output terminal TER2, and a control terminal that receives the feedback signal from the control node Ng.

The first calibration transistor unit CTU1 that calibrates an input impedance of the first output terminal TER1 is connected in parallel to the first load transistor Tp in response to a first calibration control signal. The first calibration control signal controls switches Sp11, Sp21, Sp31, Sp41, and Sp51.

The first calibration transistor unit CTU1 includes a first calibration unit, a second calibration unit, a third calibration unit, a fourth calibration unit, and a fifth calibration unit. However, the present invention is not limited thereto. Generally speaking, the first calibration transistor unit CTU1 can include M calibration units (where M is a natural number greater than 1).

The first calibration unit includes the transistor Tpc1 and the switch Sp11. The second calibration unit includes the transistor Tpc2 and the switch Sp21. The third calibration unit includes the transistor Tpc3 and the switch Sp31. The fourth calibration unit includes the transistor Tpc4 and the switch Sp41. The fifth calibration unit includes the transistor Tpc5 and the switch Sp51.

One terminal of an mth calibration unit switch (m is a natural number between 1 and 5) included in the first calibration transistor unit CTU1 is connected to the first output terminal TER1. An mth calibration unit transistor included in the first calibration transistor unit CTU1 includes an input terminal connected to the power voltage source VDD, an output terminal connected to another terminal of the mth calibration unit switch, and a control terminal that receives the feedback signal FB from a control node Ng.

If the mth calibration unit switch is turned on in response to the first calibration control signal, the mth calibration unit transistor is connected in parallel to the first load transistor Tp. The first calibration control signal controls the number of the first through fifth calibration unit transistors Tpc1, Tpc2, Tpc3, Tpc4, and Tpc5 that are connected in parallel to the first load transistor Tp, thereby calibrating the input impedance of the first output terminal TER1. As described above, the calibration of the input impedance of the first output terminal TER1 can result in the minimization of an IM2 component included in the first and second low frequency data signals Vp and Vn. The input impedance of the first output terminal TER1 has a value of composite impedance of the first load transistor Tp and the first calibration transistor unit CTU1 that is connected in parallel to the first load transistor Tp. Because the first current mirror unit CMU11 has a very large input impedance, the first current mirror unit CMU11 does not affect the input impedance of the first output terminal TER1.

The first current mirror unit CMU11 prevents the first calibration current from entering the first output terminal TER1 by discharging the first calibration current through a separate path in response to a first discharge control signal. The first discharge control signal controls switches Sp12, Sp22, Sp32, Sp42, and Sp51. Because the calibration current does not increase or decrease a current that enters the first output terminal TER1, a DC offset is prevented in the first and second low frequency data signals Vp and Vn.

The first current mirror unit CMU11 includes current source Ipvar, a first mirror transistor Mp, a first discharge unit, a second discharge unit, a third discharge unit, a fourth discharge unit, and a fifth discharge unit. However, the present invention is not limited thereto. Generally speaking, the first current mirror unit CMU11 can include the source Ipvar, and M discharge units (where M is a natural number greater than 1).

The first discharge unit includes the switch Sp12 and the transistor Mpc1. The second discharge unit includes the switch Sp22 and the transistor Mpc2. The third discharge unit includes the switch Sp32 and the transistor Mpc3. The fourth discharge unit includes the switch Sp42 and the transistor Mpc4. The fifth discharge unit includes the switch Sp52 and the transistor Mpc5.

The first mirror current source Ipvar provides the first mirror transistor Mp with the first control current Ip corresponding to the first calibration current that is output from the first calibration transistor unit CTU1. The first mirror current source Ipvar is a variable current source that provides the first mirror transistor Mp with the first control current Ip corresponding to the number of the discharge unit switches Sp12 through Sp52 that are turned on. In more detail, the higher the first calibration current output from the first calibration transistor unit CTU1, the higher the first control current Ip becomes. The lower the first calibration current output from the first calibration transistor unit CTU1, the lower the first control current Ip becomes. The first mirror transistor Mp includes an input terminal that receives the first control current Ip, a control terminal connected to the input terminal, and an output terminal that discharges the first control current Ip.

One terminal of an mth discharge unit switch (m is a natural number between 1 and 5) included in the first current mirror unit CMU11 is connected to the first output terminal TER1. An mth discharge unit transistor included in the first current mirror unit CMU11 includes an input terminal connected to another terminal of the mth discharge unit switch, a control terminal connected to the control terminal of the first mirror transistor Mp, and an output terminal connected to a ground voltage. The mth discharge unit transistor included in the first current mirror unit CMU11 discharges the first calibration current that is output from the first calibration transistor unit CTU1 when the mth discharge unit switch is turned on in response to the first discharge control signal. The first discharge control signal controls switches Sp12 through Sp52 to prevent the first calibration current from entering the first output terminal TER1.

The second load transistor Tn, the second calibration transistor unit CTU2, and the second current mirror unit CMU21 will now be described in brief.

The second load transistor Tn is connected between the power voltage source VDD and the second output terminal TER2, and provides the second output terminal TER2 with a second load current corresponding to the feedback signal FB.

The second calibration transistor unit CTU2 is connected in parallel to the second load transistor Tn in response to a second calibration control signal in order to calibrate input impedance of the second output terminal TER2. The second calibration control signal controls switches Sn11, Sn21, Sn31, Sn41, and Sn51. The input impedance of the second output terminal TER2 has a value of composite impedance of the second load transistor Tn and the second calibration transistor unit CTU2 that is connected in parallel thereto. The calibration of the input impedance of the second output terminal TER2 can result in the minimization of the IM2 component included in the first and second low frequency data signals Vp and Vn.

Generally speaking, the second calibration transistor unit CTU2 can include N calibration units (N is a natural number greater than 1). In the illustrated embodiment, an nth calibration unit (n is a natural number between 1 and 5) included in the second calibration transistor unit CTU2 includes an nth calibration unit transistor Tnc1, Tnc2, Tnc3, Tnc4, or Tnc5 and an nth calibration unit switch Sn11, Sn21, Sn31, Sn41, or Sn51. The nth calibration unit transistor Tnc1, Tnc2, Tnc3, Tnc4, or Tnc5 included in the second calibration transistor unit CTU2 is connected in parallel to the second load transistor Tn when the nth calibration unit switch Sn11, Sn21, Sn31, Sn41, or Sn51 is turned on in response to the second calibration control signal.

The second current mirror unit CMU21 prevents the second calibration current from entering the second output terminal TER2 by discharging the second calibration current through a separate path in response to a second discharge control signal. Accordingly, the second calibration current does not increase or decrease a current that enters the second output terminal TER2, and a DC offset is prevented in the first and second low frequency data signals Vp and Vn.

The second current mirror unit CMU21 includes a second mirror current source Invar, a second mirror transistor Mn, and n discharge units. An nth discharge unit (n is a natural number between 1 and 5) included in the second current mirror unit CMU21 includes an nth discharge unit switch and an nth discharge unit transistor. The nth discharge unit transistor included in the second current mirror unit CMU21 discharges the second calibration current that is output from the second calibration transistor unit CTU2 when the nth discharge unit switch is turned on in response to the second discharge control signal. The second discharge control signal controls the switches Sn12 through Sn52 to prevent the second calibration current from entering the second output terminal TER2. The second mirror current source Invar is a variable current source that provides the second mirror transistor Mn with the second control current In corresponding to the number of switches Sn12 through Sn52 that are turned on.

Although the mixer of the embodiment illustrated in FIG. 6 includes the first calibration transistor unit CTU1 and the first current mirror unit CMU11 connected to the first output terminal TER1, and the second calibration transistor unit CTU2 and the second current mirror unit CMU21 connected to the second output terminal TER2, the present invention is not limited thereto. For example, in an alternative embodiment, the mixer could include the mixing unit MU, the common mode amplification unit CMA, the first load transistor Tp, the second load transistor Tn, the first calibration transistor unit CTU1 and the first current mirror unit CMU11 without the second calibration transistor unit CTU2 and without the second current mirror unit CMU21. Alternatively, the mixer could include the mixing unit MU, the common mode amplification unit CMA, the first load transistor Tp, the second load transistor Tn, the second calibration transistor unit CTU2 and the second current mirror unit CMU21 without the first calibration transistor unit CTU1 and without the first current mirror unit CMU11.

Embodiments of the invention thus provide a mixer that can be used for a direct conversion receiver. The disclosed mixers can reduce an IM2 signal component using a limited circuit area. Furthermore, embodiments of the invention can prevent a DC offset from occurring when the IM2 component is reduced.

While the invention has been particularly shown and described with reference to an exemplary embodiment thereof, it will be understood by those of ordinary skill in the art that various changes in form and detail may be made therein without departing from the spirit and scope of the present invention as defined by the following claims.

What is claimed is:
1. A mixer comprising:
   a mixing unit configured to mix high frequency data signals and local oscillation (LO) signals, generate first and second low frequency data signals, and output the first and second low frequency data signals to first and second output terminals, respectively;
   a common mode amplification unit coupled to the mixing unit, the common mode amplification unit configured to compare a common mode voltage of the first and second low frequency data signals and a predetermined reference voltage, the common mode amplification unit further configured to output a feedback signal at a control node based on the comparison;
   a first load transistor coupled to the first output terminal and the control node, the first load transistor configured to provide the first output terminal with a first load current corresponding to the feedback signal;
   a first calibration transistor unit connected in parallel to the first load transistor in order to calibrate an input impedance of the first output terminal; and
   a first current mirror unit coupled to the first calibration transistor unit, the first current mirror unit configured to discharge a first calibration current that is output from the first calibration transistor unit to prevent the first calibration current from entering the first output terminal.

2. The mixer of claim 1, wherein the common mode amplification unit includes:
   a first common resistor connected between the first output terminal and a common mode voltage node;

a second common resistor connected between the second output terminal and the common mode voltage node; and an amplifier, a first input of the amplifier coupled to the predetermined reference voltage, a second input of the amplifier coupled to the common mode voltage node, an output of the amplifier coupled to the control node.

3. The mixer of claim 1, wherein the first load transistor includes:
an input terminal connected to a power supply voltage;
an output terminal connected to the first output terminal; and
a control terminal connected to the control node.

4. The mixer of claim 1, wherein the first calibration transistor unit includes: at least one calibration transistor, each of the at least one calibration transistors having:
an input terminal connected to a power supply voltage; and
a control terminal receiving the feedback signal from the control node.

5. The mixer of claim 4, wherein an output terminal of each of the at least one calibration transistors is coupled to the first output terminal.

6. The mixer of claim 4, wherein the first calibration transistor unit further includes at least one switch, a first terminal of each of the at least one switches being coupled to an output terminal of a corresponding one of the at least one calibration transistors, a second terminal of each of the at least one switches being coupled to the first output terminal, each of the at least one switches being controlled by a first calibration control signal.

7. The mixer of claim 6, wherein the first current mirror unit includes:
a first mirror current source; and
at least one mirror transistor, an output of the first mirror current source coupled to a control terminal of each of the at least one mirror transistors, an output terminal of each of the at least one mirror transistors coupled to a ground voltage.

8. The mixer of claim 7, wherein an input terminal of each of the at least one mirror transistors is coupled to the first output terminal.

9. The mixer of claim 7, wherein the first current mirror unit further comprises at least one mirror switch, a first terminal of each of the at least one mirror switches being coupled to the first output terminal, a second terminal of each of the at least one mirror switches being coupled to an input terminal of a corresponding one of the at least one mirror transistors, each of the at least one mirror switches being controlled by a first discharge control signal.

10. The mixer of claim 1, wherein the first current mirror unit includes:
a first mirror current source; and
at least one mirror transistor, an output of the first mirror current source coupled to a control terminal of each of the at least one mirror transistors, an output terminal of each of the at least one mirror transistors coupled to a ground voltage.

11. The mixer of claim 10, wherein an input terminal of each of the at least one mirror transistors is coupled to the first output terminal.

12. The mixer of claim 10, wherein the first current mirror unit further comprises at least one mirror switch, a first terminal of each of the at least one mirror switches being coupled to the first output terminal, a second terminal of each of the at least one mirror switches being coupled to an input terminal of a corresponding one of the at least one mirror transistors, each of the at least one mirror switches being controlled by a first discharge control signal.

13. The mixer of claim 12, further comprising:
a second load transistor coupled to the second output terminal and the control node, the second load transistor configured to provide the second output terminal with a second load current corresponding to the feedback signal;
a second calibration transistor unit connected in parallel to the second load transistor in order to calibrate an input impedance of the second output terminal; and
a second current mirror unit coupled to the second calibration transistor unit, the second current mirror unit configured to discharge a second calibration current that is output from the second calibration transistor unit to prevent the second calibration current from entering the second output terminal.

14. The mixer of claim 1, further comprising:
a second load transistor coupled to the second output terminal and the control node, the second load transistor configured to provide the second output terminal with a second load current corresponding to the feedback signal;
a second calibration transistor unit connected in parallel to the second load transistor in order to calibrate an input impedance of the second output terminal; and
a second current mirror unit coupled to the second calibration transistor unit, the second current mirror unit configured to discharge a second calibration current that is output from the second calibration transistor unit to prevent the second calibration current from entering the second output terminal.

15. The mixer of claim 14, wherein the second load transistor includes:
an input terminal connected to a power supply voltage;
an output terminal connected to the second output terminal; and
a control terminal connected to the control node.

16. The mixer of claim 14, wherein the second calibration transistor unit includes at least one calibration transistor, each of the at least one calibration transistors having an input terminal connected to a power supply voltage and a control terminal receiving the feedback signal from the control node, the second calibration transistor unit further including at least one switch, a first terminal of each of the at least one switches being coupled to an output terminal of a corresponding one of the at least one calibration transistors, a second terminal of each of the at least one switches being coupled to the second output terminal, each of the at least one switches being controlled by a second calibration control signal.

17. The mixer of claim 14, wherein the second current mirror unit includes:
a first mirror current source; and
at least one mirror transistor, an output of the first mirror current source coupled to a control terminal of each of the at least one mirror transistors, an output terminal of each of the at least one mirror transistors coupled to a ground voltage.

18. The mixer of claim 17, wherein the second current mirror unit further comprises at least one mirror switch, a first terminal of each of the at least one mirror switches being coupled to the second output terminal, a second terminal of each of the at least one mirror switches being coupled to an input terminal of a corresponding one of the at least one mirror transistors, each of the at least one mirror switches being controlled by a first discharge control signal.

19. The mixer of claim 1, further comprising a second load transistor coupled to the second output terminal and the control node, the second load transistor configured to provide the second output terminal with a second load current corresponding to the feedback signal.

20. The mixer of claim 19, further comprising a second calibration transistor unit connected in parallel to the second load transistor in order to calibrate an input impedance of the second output terminal.

* * * * *